United States Patent
Kim

(10) Patent No.: US 8,830,753 B2
(45) Date of Patent: Sep. 9, 2014

(54) NONVOLATILE MEMORY DEVICES, METHODS OF PROGRAMMING THE SAME, AND MEMORY SYSTEMS INCLUDING THE SAME

(75) Inventor: Seung-bum Kim, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 374 days.

(21) Appl. No.: 13/194,013

(22) Filed: Jul. 29, 2011

(65) Prior Publication Data

US 2012/0026797 A1    Feb. 2, 2012

(30) Foreign Application Priority Data

Jul. 29, 2010   (KR) .................. 10-2010-0073532

(51) Int. Cl.
*G11C 16/04* (2006.01)
*G11C 16/06* (2006.01)
*G11C 16/10* (2006.01)
*G11C 16/24* (2006.01)

(52) U.S. Cl.
CPC ............... *G11C 16/10* (2013.01); *G11C 16/24* (2013.01); *G11C 16/0483* (2013.01)
USPC ........... 365/185.18; 385/185.08; 385/185.17; 385/185.25; 385/189.05

(58) Field of Classification Search
USPC ............. 365/185.08, 185.17, 185.18, 185.25, 365/189.05, 185.21
See application file for complete search history.

(56) References Cited

U.S. PATENT DOCUMENTS

| | | | |
|---|---|---|---|
| 6,850,438 B2 * | 2/2005 | Lee et al. | 365/185.11 |
| 6,937,510 B2 * | 8/2005 | Hosono et al. | 365/185.03 |
| 7,242,620 B2 * | 7/2007 | Nagashima | 365/185.21 |
| 2008/0062764 A1 * | 3/2008 | Tanaka et al. | 365/185.17 |

FOREIGN PATENT DOCUMENTS

| | | |
|---|---|---|
| JP | 2009064516 A | 3/2009 |
| KR | 100594280 | 12/2005 |
| KR | 100645049 | 4/2006 |

\* cited by examiner

*Primary Examiner* — Tha-O H Bui
(74) *Attorney, Agent, or Firm* — Harness, Dickey & Pierce, P.L.C.

(57) ABSTRACT

A nonvolatile memory device including a bit line connected to a cell string, a page buffer connected to the bit line, the page buffer is configured to output a target bit line forcing voltage level to the bit line during a programming operation, and a bit line forcing voltage clamp circuit connected between the bit line and the page buffer, and the bit line forcing voltage clamp circuit is configured to adjust the target bit line forcing voltage level to the bit line.

14 Claims, 7 Drawing Sheets

NONVOLATILE MEMORY DEVICES, METHODS OF PROGRAMMING THE SAME, AND MEMORY SYSTEMS INCLUDING THE SAME

CROSS-REFERENCE TO RELATED APPLICATIONS

This application claims priority under 35 U.S.C. §119 to Korean Patent Application No. 10-2010-0073532, filed on Jul. 29, 2010, in the Korean Intellectual Property Office, the entire contents of which are incorporated herein by reference.

BACKGROUND

Inventive concepts relate to semiconductor memory devices, and more particularly, to nonvolatile memory devices.

A semiconductor memory device is a memory device in which data can be stored and the stored data can be read whenever desired. The semiconductor memory device is classified as a volatile memory device or a nonvolatile memory device. When not powered, a volatile memory device loses stored data. Examples of the volatile memory device include a static random access memory (SRAM), a dynamic random access memory (DRAM), and a synchronous dynamic random access memory (SDRAM). A nonvolatile memory device retains the stored data even when not powered. Examples of a nonvolatile memory device include a read only memory (ROM), a programmable read only memory (PROM), an erasable read only memory (EPROM), an electrically erasable programmable read only memory (EEPROM), a flash memory device, a phase-change random access memory (PRAM), a magnetoresistive random access memory (MRAM), a resistive random access memory (RRAM), and a ferroelectric random access memory (FRAM). The flash memory device is classified into a NOR type or a NAND type.

SUMMARY

Inventive concepts provide a nonvolatile memory device that clamps a bit line forcing level, and a method of programming the nonvolatile memory device.

According to an aspect of inventive concepts, there is provided a nonvolatile memory device including a bit line connected to a cell string, a page buffer that is connected to the bit line and configured to output a target bit line forcing voltage level to the bit line during a programming operation, and a bit line forcing voltage clamp circuit that is connected between the bit line and the page buffer, and configured to adjust the target bit line forcing voltage level.

The page buffer may include a bit line shut off transistor, and the bit line forcing voltage clamp circuit may be located between the bit line shut off transistor and the bit line.

The bit line forcing voltage clamp circuit may include a direct current (DC) voltage generator generating a bit line forcing voltage having the same voltage level as the target bit line forcing voltage level, and at least one transistor selectively outputting the generated bit line forcing voltage level to the bit line.

The DC voltage generator may generate a voltage of 1 V.

The cell string may include a plurality of memory cells that are serially connected and a string select transistor and a ground select transistor that are each connected to the memory cells. After the page buffer is enabled, the bit line forcing voltage clamp circuit is configured to be enabled.

After the page buffer is enabled and when a previously set voltage level is fanned to the bit line, the bit line forcing voltage clamp circuit may be enabled.

The page buffer and the bit line forcing voltage clamp circuit may be enabled simultaneously.

A scheme of the programming operation may be an all bit line (ABL) architecture.

According to another aspect of inventive concepts, there is provided a nonvolatile memory device including a bit line connected to a cell string, a page buffer that is connected to the bit line, and a bit line forcing voltage clamp circuit that is connected between the bit line and the page buffer, and configured to output a target bit line forcing voltage level by using a DC voltage generator having the same voltage level as the target bit line forcing voltage level.

According to another aspect of inventive concepts, there is provided a memory system including a nonvolatile memory device, and a controller controlling the nonvolatile memory device. The nonvolatile memory device includes a bit line connected to a cell string, a page buffer that is connected to the bit line and configured to output a target bit line forcing voltage level to the bit line during a programming operation, and a bit line forcing voltage clamp circuit that is connected between the bit line and the page buffer, and configured to adjust the target bit line forcing voltage level.

The nonvolatile memory device and the controller may constitute a semiconductor disk device.

The nonvolatile memory device and the controller may constitute a memory card.

According to another aspect of inventive concepts, there is provided a method of programming of a nonvolatile memory device, the method including forming a target bit line forcing voltage level. The forming is performed by using a page buffer. The method further includes controlling a programming operation by adjusting the target bit line forcing voltage level. The controlling a programming operation is performed by a DC voltage generator. The DC voltage generator is connected between the bit line and the page buffer, and generates a bit line forcing voltage level having the same voltage level as the target bit line forcing voltage level.

According to another aspect of inventive concepts, a nonvolatile memory device includes a bit line, a bit line forcing voltage clamp circuit connected to the bit line and configured to output a first bit line voltage level to the bit line, and a page buffer configured to output a second bit line voltage level to the bit line.

BRIEF DESCRIPTION OF THE DRAWINGS

Example embodiments of inventive concepts will be more clearly understood from the following detailed description taken in conjunction with the accompanying drawings in which.

DETAILED DESCRIPTION OF EXAMPLE EMBODIMENTS

Figure 1:
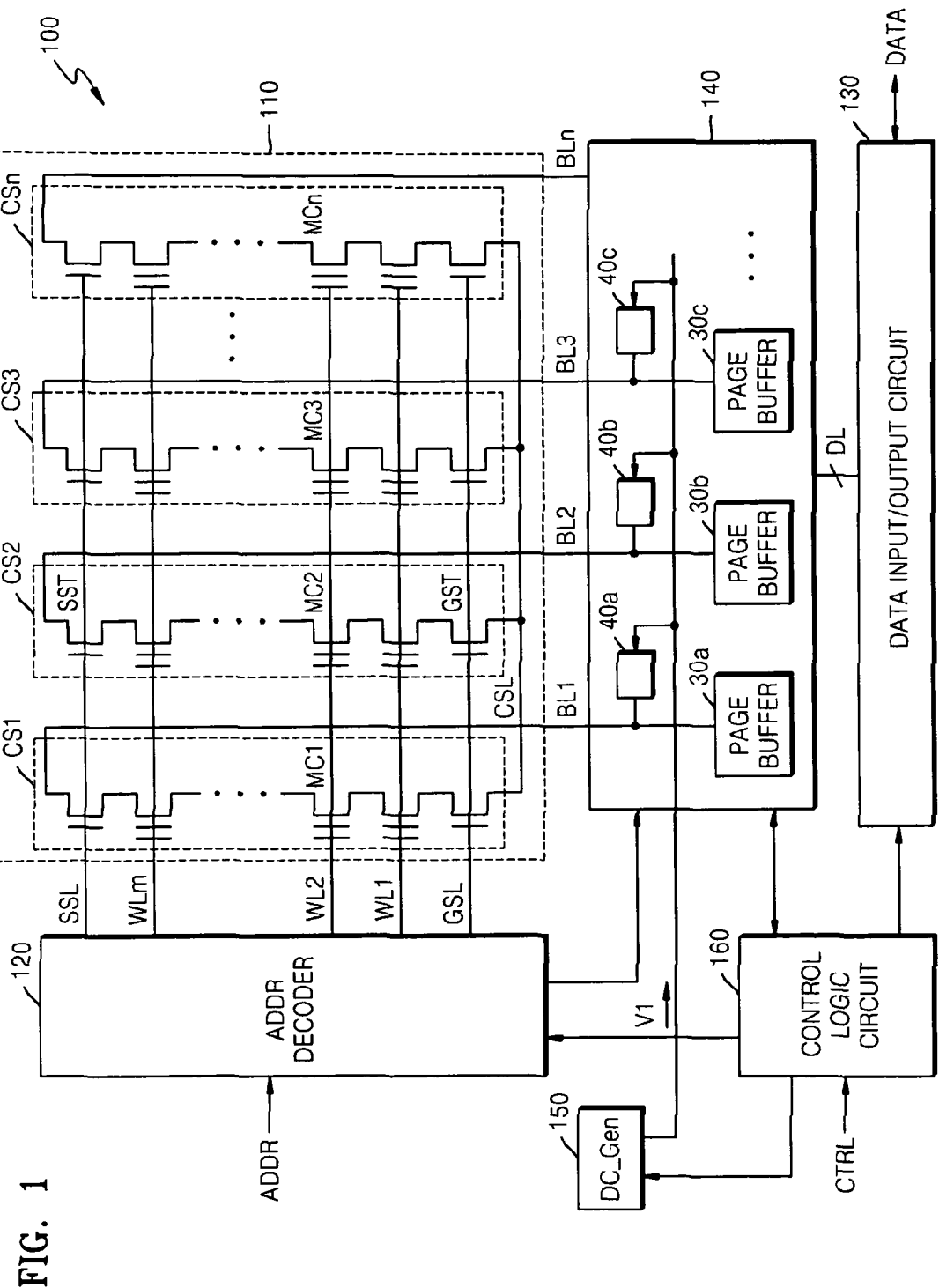
FIG. 1 is a block diagram illustrating a nonvolatile memory device according to an example embodiment of inventive concepts.

Various example embodiments will be described more fully hereinafter with reference to the accompanying drawings, in which some example embodiments are shown. Inventive concepts may, however, be embodied in many different forms and should not be construed as limited to the example embodiments set forth herein. Rather, these example embodiments are provided so that this disclosure will be thorough and complete, and will fully convey the scope of the inventive concepts to those skilled in the art. In the drawings, the sizes and relative sizes of elements may be exaggerated for clarity. Like numerals refer to like elements throughout.

It will be understood that, although the terms first, second, third etc. may be used herein to describe various elements, these elements should not be limited by these terms. These terms are used to distinguish one element from another. Thus, a first element discussed below could be termed a second element without departing from the teachings of inventive concepts. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of the inventive concepts. As used herein, the singular forms "a," "an" and "the" are intended to include the plural forms as well, unless the context clearly indicates otherwise. It will be further understood that the terms "comprises", "comprising", "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which these inventive concepts belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram illustrating a nonvolatile memory device 100, according to an example embodiment of inventive concepts. Here, a flash memory device is illustrated as an example of the nonvolatile memory device 100. However, inventive concepts are not limited to a flash memory device. For example, inventive concepts may be applied to all types of nonvolatile memory devices (e.g., a read only memory (ROM), a programmable read only memory (PROM), an erasable read only memory (EPROM), an electrically erasable programmable read only memory (EEPROM), a flash memory device, a phase-change random access memory (PRAM), a magnetoresistive random access memory (MRAM), a resistive random access memory (RRAM), and ferroelectric random access memory (FRAM)) in which programming disturbance may be generated during a programming operation. Also, it will be understood that various changes in form and details of inventive concepts may be made.

Referring to FIG. 1, the nonvolatile memory device 100 comprises a memory cell array 110, an address decoder 120, a data input/output circuit 130, a read/write circuit 140, a direct current (DC) voltage generator 150, and a control logic circuit 160.

The memory cell array 110 is connected to the address decoder 120 via a string select line SSL, word lines WL1 through WLm, and a ground select line GSL, and is connected to the read/write circuit 140 via bit lines BL1 through BLn. The memory cell array 110 comprises a plurality of memory cells MC, and a plurality of cell strings CS1 through CSn comprising the serially connected memory cells MC between the bit lines BL1 through BLn and a common source line CSL. The cell strings CS1 through CSn comprise a plurality of memory cells MC that are serially connected, and a string select transistor SST and a ground select transistor GST that are connected to the memory cells MC. The plurality of the cell strings CS1 through CSn are arranged so as to faun the memory cell array 110. The nonvolatile memory device 100 may include a plurality of the memory cell arrays 110. However, here, the nonvolatile memory device 100 includes one memory cell array 110 for convenience of description. One memory cell array 110 constitutes one block, and an operation of erasing memory cell data is performed block-by-block.

As described above, the memory cell array 110 includes a plurality of cell strings CS1 through CSn that are connected to n bit lines BL1 through BLn. Gates of the memory cells MC1 of the cell string CS1 are respectively connected to the word lines WL1 through WLm. The gates of the string select transistors SST that respectively connect the cell strings CS1 through CSn to the bit lines BL1 through BLn are connected to the string select line SSL. Gates of the ground selection transistors GST that respectively connect the bit lines BL1 through BLn to the common source line CSL are connected to the ground select line GSL.

The address decoder 120 is connected to the memory cell array 110, the read/write circuit 140, and the control logic circuit 160. The address decoder 120 operates in response to a control signal of the control logic circuit 160. The address decoder 120 receives an address ADDR from the outside.

The address decoder 120 decodes a column address from among addresses ADDR to select the word lines WL1 through WLm. The address decoder 120 decodes a row address from among the addresses ADDR and provides the row address to the read/write circuit 140. For example, the address decoder 120 may include well-known components such as a column decoder, a row decoder, and an address buffer.

The data input/output circuit 130 is connected to the read/write circuit 140 and the control logic circuit 160. The data input/output circuit 130 operates in response to a control signal of the control logic circuit 160. The data input/output circuit 130 exchanges data DATA with the outside. The data input/output circuit 130 transmits data DATA received from the outside to the read/write circuit 140. The data input/output circuit 130 may include well-known components such as a data buffer.

The read/write circuit 140 is connected to the memory cell array 110, the address decoder 120, the data input/output circuit 130, and the control logic circuit 160. The read/write circuit 140 operates in response to a control signal of the control logic circuit 160. The read/write circuit 140 selects bit lines BL1 through BLn in response to a row address received from the address decoder 120. The read/write circuit 140 writes data transmitted by the input/output circuit 130 via data lines DL, to selected memory cells. The read/write circuit 140 reads data stored in the selected memory cells, and transmits the data to the data input/output circuit 130 via the data lines DL. The read/write circuit 140 may be formed of row selection circuits (not shown), page buffers 30a, 30b, and 30c respectively connected to row selection circuits and the bit lines BL1 through BLn, and a plurality of bit line forcing voltage clamp circuits 40a, 40b, and 40c that are respectively connected between the bit lines BL1 through BLn and the page buffers 30a, 30b, and 30c. The bit line forcing voltage clamp circuits 40a, 40b, and 40c receive a first bit line forcing voltage V1 from the DC voltage generator 150. A configuration comprising the bit lines BL1 through BLn to each of which a page buffer is connected is referred to as an all bit line (ABL) architecture. While the DC voltage generator 150 is illustrate as outside of the bit line forcing voltage clamp circuits 40a, 40b, and 40c, it should be understood that the DC voltage generator 150 may be included in the bit line forcing voltage clamp circuits 40a, 40b, and 40c.

The page buffers 30a, 30b, and 30c adjust voltages, such as a bit line forcing voltage, a program voltage, a program inhibit voltage, or the like. Since the page buffers are well known in the art, description thereof will be omitted. Alternatively, the read/write circuit 140 may be foamed of a row selection circuit, a write driver, a sense amplifier, or the like.

The DC voltage generator 150 is connected to the control logic circuit 160. The DC voltage generator 150 operates in response to a control signal of the control logic circuit 160. The DC voltage generator 150 transmits the first bit line forcing voltage V1 to the bit line forcing voltage clamp circuits 40a, 40b, and 40c. The first bit line forcing voltage V1 has the same voltage level as a target bit line forcing voltage that is to be forced to each bit line.

The control logic circuit 160 controls the overall operation of the nonvolatile memory device 100.

The bit line forcing voltage clamp circuits 40a, 40b, and 40c are advantageous in preventing incremental-step-pulse programming (ISPP) distortion and decreasing programming performance, which will be described with reference to FIGS. 3A through 3E.

First, for better understanding of inventive concepts, bit line forcing will be described.

To a bit line of a memory cell to be programmed, a voltage that can generate Fowler-Nordheim (F-N) tunneling is provided, and string select transistors are turned on. As 0 V is applied to the bit line of the memory cell to be programmed, the memory cell is programmed. However, for some bit lines that are selected for programming, an excessive increase in a threshold voltage of the bit lines should be controlled. An example thereof is a programming operation for controlling a threshold voltage distribution of a multi-level cell (MLC) to be dense. Accordingly, in this case, not 0V but a bit line forcing voltage is provided to the bit line of the memory cell to be programmed, thereby generating a potential difference between a channel and a gate of the memory cell to be programmed. Controlling a bit line to be programmed is referred to as bit line forcing or 1 V_forcing. Due to the bit line forcing, excessive F-N tunneling effects in a memory cell may be controlled. For example, when applying a program voltage Vpgm of 18V to a cell to be programmed, to a cell to which bit line forcing is to be performed, an effect of applying a program voltage Vpgm of 17 V is produced. Due to the above-described effect, a dense threshold voltage distribution may be formed after programming.

When performing bit line forcing as described above, in a shielded bit line (SBL) architecture in which a page buffer shares at least two bit lines, a possible bit line-bit line capacitive coupling effect is not generated. However, as a program scheme is changed from a SBL architecture to an ABL architecture, and memory cells obtain larger capacity and are arranged in a denser configuration, spaces between the bit lines are reduced. Consequently, capacitive coupling is increased, and the bit line-bit line capacitive coupling effect is generated between the bit lines. In sum, in the ABL architecture, the ISPP distortion or decrease in programming performance, which will be described with reference to FIGS. 3A through 3E, may occur when performing bit line forcing due to the bit line-bit line capacitive coupling effect.

Figure 2:
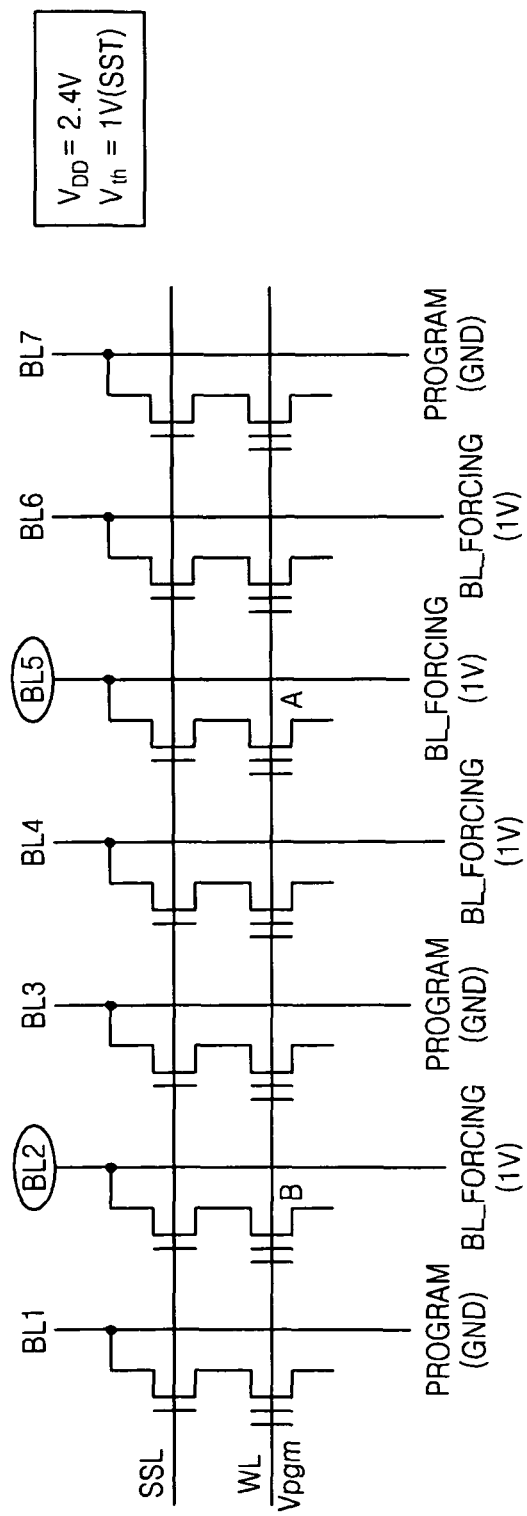
FIG. 2 is a block diagram illustrating a program setup in an all bit line (ABL) architecture.

FIG. 2 is a block diagram illustrating a program setup in an ABL architecture.

Referring to FIG. 2, a ground voltage GND may be applied to first, third, and seventh bit lines BL1, BL3, and BL7, to which programming is set, and 1 V may be applied to second, fourth, fifth, and sixth bit lines BL2, BL4, BL5, and BL6, to which bit line forcing is set. In addition, although not shown in FIG. 2, a power voltage Vcc may be applied to a bit line to which programming inhibition is set.

For convenience of description, a memory cell connected to the fifth bit line BL5, to which bit line forcing is set, is denoted by A, and a memory cell connected the second bit line BL2, to which bit line forcing is set, is denoted by B. The difference is that a ground voltage is applied to two neighboring bit lines of the second bit line BL2, and a bit line forcing voltage of 1 V is applied to two neighboring bit lines of the fifth bit line BL5. Hereinafter, a state of the memory cell B of the second bit line BL2 in which a ground voltage is applied to two neighboring bit lines of the second bit line BL2 will be referred to as a memory cell case B, and a state of the memory cell A of the fifth bit line BL5B in which a bit line forcing voltage of 1 V is applied to two neighboring bit lines of the fifth bit line BL5 will be referred to as a memory cell case A.

FIGS. 3A through 3E are schematic views for explaining a bit line forcing method in the nonvolatile memory device 100 having an ABL architecture in which programming is set as illustrated in FIG. 2, by using a page buffer, according to an example embodiment of inventive concepts. In other words, here, a bit line forcing voltage clamp circuit is disabled.

Figure 3A:
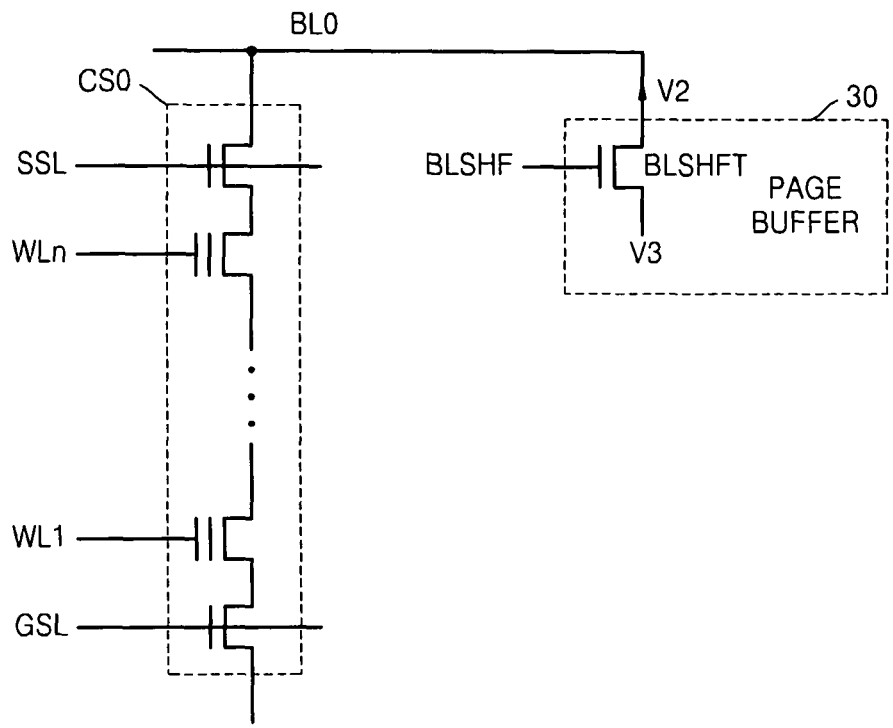
FIGS. 3A through 3E are schematic views for explaining a programming method using a page buffer, according to an example embodiment of inventive concepts.

FIG. 3A is a schematic view for explaining a bit line forcing method of a memory cell, when a bit line forcing voltage clamp circuit of FIG. 1 is not included.

Referring to FIG. 3A, a second bit line forcing voltage V2 is provided to a bit line BL0 via a page buffer 30. The page buffer 30 that includes a bit line shut off transistor BLSHFT for adjusting a voltage level (e.g., program voltage, program inhibit voltage, or bit line forcing voltage) applied to a bit line is well known to one of ordinary skill in the art. For example, the second bit line forcing voltage V2 may be applied via the page buffer 30 as follows. For example, a third voltage V3 and a bit line shut off level are set as 1.8V, and a threshold voltage of the bit line shut off transistor BLSHFT is set to be 0.8V. Then, a voltage of 1 V that is a difference value of the subtraction of the bit line shut off transistor BLSHFT level minus the BLSHF level (1.8V−0.8V=1 V) is output as the second bit line forcing voltage V2. However, the bit line forcing method of the page buffer 30 using the bit line shut off transistor BLSHFT causes variation in voltages applied to a bit line of the memory cell case A and a bit line of the memory cell case B, and particularly in the ABL architecture, as illustrated in FIG. 3B.

Figure 3B:
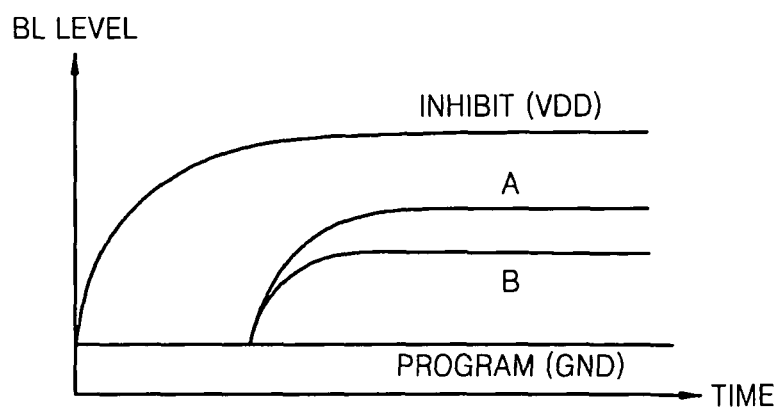

In FIG. 3B, a vertical axis denotes a bit line voltage level, and a horizontal axis denotes time. In a scheme according to an ABL program, variation is generated in a forcing level during bit line forcing according to a state of neighboring cells. For example, 1 V may be applied to the second bit line BL2 of the memory cell case B and the fifth bit line BL5 of the memory cell case A from the page buffer, and thus the second and fifth bit lines BL2 and BL5 may be set for bit line forcing. However, according to types of the state of a voltage of neighboring cells, whether the state is program, program inhibit, or bit line forcing BL_forcing, a voltage level of a voltage that is substantially applied to the fifth bit line BL5 of the memory cell A is higher than a voltage level of a voltage that is applied to the second bit line BL2 of the memory cell B. This is because, for example, in the memory cell case A, the memory cell A and neighboring cells of the memory cell A are all at 1 V_forcing, and the voltage level increases most quickly and highest. As a result, as illustrated in FIG. 3A, variation is generated in the bit line forcing voltage levels between the memory cell case A and the memory cell case B. Also this gap is not reduced even over time. The reason for this will be described later with reference to FIG. 3E.

In sum, according to the three states of three neighboring memory cells of three neighboring bit lines, respectively such as Program—Bit line forcing BL_Forcing—Program or Program inhibit—Bit line forcing BL_Forcing—Program Inhibit or Bit line forcing BL_Forcing—Bit line forcing BL_Forcing—Bit line forcing BL_Forcing different bit line forcing voltage levels are set to different bit lines, respectively. This variation may cause ISPP distortion, and when a bit line level increases over a predetermined value, ISPP distortion may be generated according to a threshold voltage Vth of a string select transistor SST. When the bit line forcing level is reduced in order to solve this problem, programming performance may be decreased.

Figure 3C:
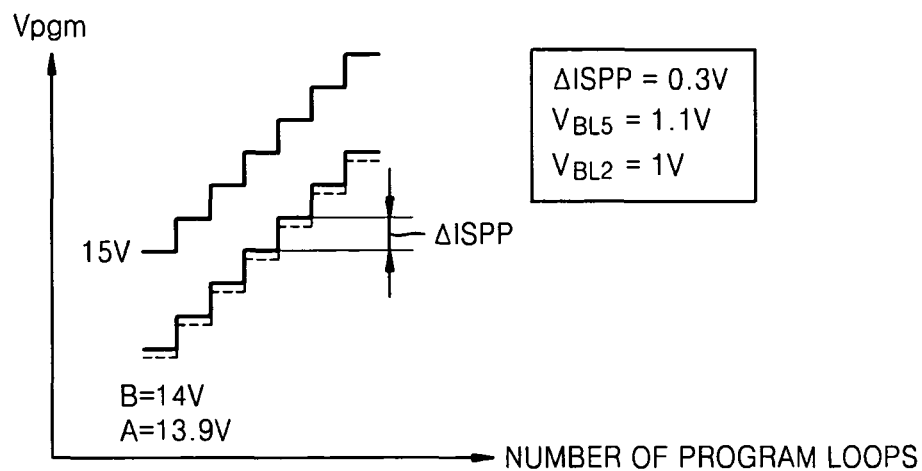

Hereinafter, the ISPP distortion caused due to the variation in bit line forcing voltage levels will be described in detail with reference to FIGS. 3C through 3E.

For example, in order to accurately control a threshold voltage distribution of a multi-level cell (MLC) that stores multiple pieces of data in one cell, an ISPP method is used. In the ISPP method, a program voltage Vpgm is increased stepwise according to repetition of program loops of program cycles, as illustrated in FIG. 3C. The program voltage Vpgm is increased by a set increment ($\Delta$ISPP). As a programming operation is performed, a threshold voltage of a cell being programmed is increased by a set increment ($\Delta$ISPP) in a program loop. Thus, to reduce a width of a threshold voltage distribution of a cell that is finally programmed, the increment ($\Delta$ISPP) of the program voltage needs to be small.

Referring to FIG. 3C again, for better understanding of description, for example, $\Delta$ISPP is 0.3V, a bit line voltage level set to the memory cell A is 1.1 V, and a bit line voltage level set to the memory cell B is 1 V. The reason why the bit line voltage level of the memory cell A is higher than that of the memory cell B is described with reference to FIG. 3B and thus will be omitted here. Consequently, if a program voltage Vpgm initially applied to a gate of a cell to be programmed is 15V, an effect that the memory cell A and the memory B to which bit line forcing is to be performed, are programmed by 13.9V and 14V, respectively, is generated. The reason for this is described above with respect to bit line forcing. However, the problem lies in that when two neighboring cells of the memory cell A change to program inhibit cells, the increment ($\Delta$ISPP) of the program voltage may be changed to 0.4 V. This is because the bit line voltage level may be 1 V, which is lower than 1.1 V, when the two neighboring memory cells of the memory cell A turn to program inhibit memory cells.

Next, when a bit line voltage level increases over a predetermined value, ISPP distortion may be generated according to the threshold voltage Vth of the string select transistor SST, which will be described below with reference to FIG. 3D. Here, the memory cell A will be described as an example. The threshold voltage Vth of the string select transistor SST may be 1 V.

Figure 3D:
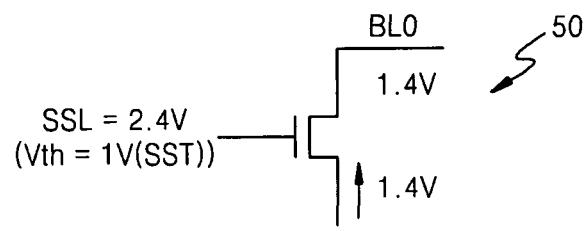

Referring to FIG. 3D, a program voltage Vpgm of 2.4 V is applied to the string select transistor SSL, and when a level of a bit line BL0 is over 1.4 V, the memory cell of the bit line BL0 is in a program inhibit state. That is, a gate-source voltage Vgs of the string select transistor SSL does not reach the threshold voltage Vth, and thus the string select transistor SSL is shut off. Channel potentials of floated strings are increased by a coupling effect, and accordingly, F-N tunneling between gates and channels of the memory cells is blocked. Consequently, cell strings which are to be programmed are floated.

Figure 3E:
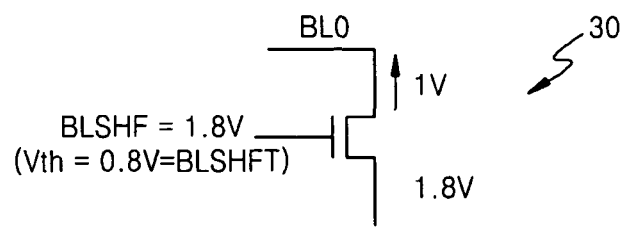

As illustrated in FIG. 3E, the problem of floating is also generated when using the bit line shut off transistor BLSHFT. Here, the memory cell A will be described as an example again. For example, as described above with reference to FIG. 3A, even when the bit line shut off transistor BLSHFT forms a bit line forcing voltage of 1 V, the 1 V bit line forcing voltage is booted by neighboring cells. As a result, the bit line shut off transistor BLSHFT is shut off and is floated, and thus variation between the memory cell A and the memory cell B of FIG. 3B is not reduced even over time.

Furthermore, besides the ISPP distortion, there is concern about the decrease in the programming performance when a bit line level of the memory cell B decreases under a predetermined value. For example, when a bit line shut off BLSHF level is decreased from 1.8 V to 1.5 V, a program start bias level may also be reduced by 0.3 V. As a result, the programming performance is decreased.

A bit line forcing voltage clamp circuit 40a, 40b, 40c of FIG. 1, prevents the above-described problems, which will be described in detail with reference to FIGS. 4 through 6.

Figure 4:
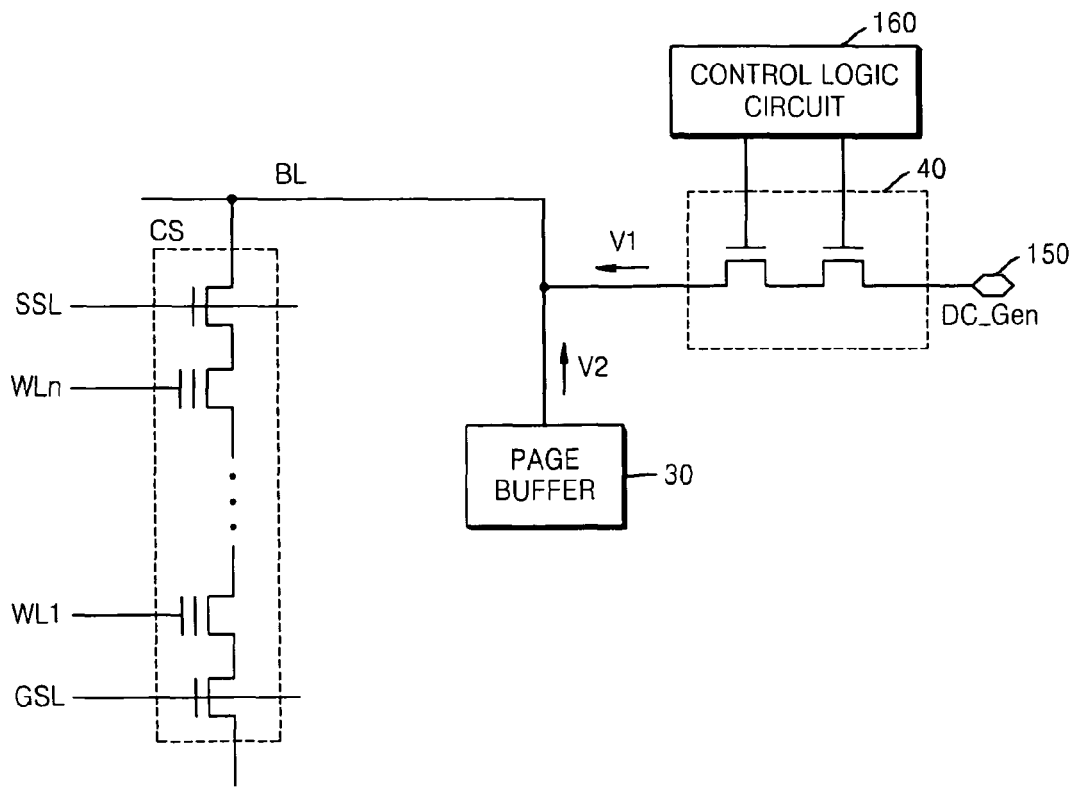
FIG. 4 is a schematic view for explaining a programming method in the nonvolatile memory device of FIG. 1, according to an example embodiment of inventive concepts.

FIG. 4 is a schematic view for explaining a programming method in the nonvolatile memory device 100 of FIG. 1, according to an example embodiment of inventive concepts.

Referring to FIGS. 1 through 4, the nonvolatile memory device 100 provides the second bit line forcing voltage V2 to the bit line BL via the page buffer 30. It should be understood that the bit line BL, the cell string CS, the page buffer 30 and the bit line forcing voltage clamp circuit 40 are one of the bit line BL1-BLn, the cell string CS1-CSn, the page buffer 30a-30c and the bit line forcing voltage clamp circuit 40a-40c, respectively, shown in FIG. 1. Also, the page buffer 30 includes the bit line shut off transistor BLSHFT as described above. A process of providing the second bit line forcing voltage V2 to the bit lines BL using the page buffer 30 is well known in the art, and an example thereof is described with reference to FIG. 3A. Thus description thereof will be omitted here. However, when a bit line forcing voltage is provided to the bit line BL only through the page buffer 30 as described with reference to FIGS. 3A through 3E, the actually applied bit line forcing voltage to the bit line BL is formed due to voltages of neighboring bit lines. That is, the second bit line forcing voltage V2 provided to the bit line via the page buffer 30 may be either higher or lower than a target bit line forcing voltage (variation).

Accordingly, the nonvolatile memory device 100 further includes the bit line forcing voltage clamp circuit 40. The bit line forcing voltage clamp circuit 40 provides a first bit line forcing voltage V1 from the DC voltage generator 150. The bit line forcing voltage clamp circuit 40 includes at least one transistor that selectively provides the first bit line forcing voltage V1. The transistor functions as a switch, and is controlled by the control logic circuit 160. The transistor functioning as a switch is well known in the art, and thus will not be described in detail. The bit line forcing voltage clamp circuit 40 is connected between the cell string CS and the page buffer 30 and is capable of finely providing a bit line forcing voltage V1 to the bit line BL because the DC voltage generator 150 continuously generates a bit line forcing voltage having the same voltage level as a target bit line voltage level, without being affected by neighboring bit lines. The DC current generator 150 may form a bit line voltage level to the bit line BL.

Figure 5:
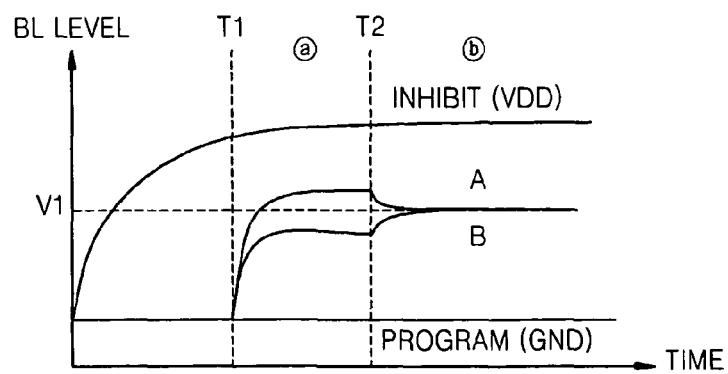
FIG. 5 is a graph illustrating a programming method of the nonvolatile memory device of FIG. 1, according to an example embodiment of inventive concepts.

FIG. 5 is a graph illustrating a programming method of the nonvolatile memory device 100 of FIG. 1, according to an example embodiment of inventive concepts.

First, the memory cell case A will be described.

Referring to FIG. 5, in connection with FIGS. 1, 2, and 4, bit line forcing of the memory cell A is executed as follows.

At precharge time T1 of the fifth bit line BL5, a power voltage VDD is applied to a string select line SSL, and a second bit line forcing voltage V2 is provided from the page buffer 30 to the fifth bit line BL5 of the cell string CS5 to which bit line forcing is to be conducted (ⓐ).

As described above with reference to FIGS. 3A through 3E, due to the influence of bit line forcing voltages of neighboring bit lines, an actual second bit line forcing voltage V2 is set to be higher than a voltage level of a target bit line. That is, there is a variation between the second bit line forcing voltage V2 and the target bit line forcing voltage.

Accordingly, upon reaching a time T2 that is previously set by the control logic circuit 160, the bit line forcing voltage clamp circuit 40 is enabled. The enabled bit line forcing voltage clamp circuit 40 applies a first bit line forcing voltage V1 to the fifth bit line BL5 of a cell string CS5 to which bit line forcing is to be conducted. Here, as described above, the DC voltage generator 150 generating a first bit line forcing voltage V1 that is at the same voltage level as a target bit line forcing level is used. By using the DC voltage generator 150, the first bit line forcing voltage V1 generated from the bit line forcing voltage clamp circuit 40 may be set to be near to the target bit line voltage as much as possible or to be the same.

For example, the time T2 that is previously set by the control logic circuit 160 may be a time point before the string select transistor is shut off as the second bit line forcing voltage V2 increases, or thereafter. Referring to FIG. 3D, the time T2 may be the time when the second bit line forcing voltage V2 reaches, for example, 1.4 V, or thereafter. Hereinafter, the memory cell case B will be described.

Bit line forcing to the memory cell B is performed as follows. At a precharge time T1 of the second bit line BL2, a power voltage VDD is applied to a string select line SSL, and a second bit line forcing voltage V2 is applied to the second bit line BL2 of a cell string CS2, to which bit line forcing is to be conducted, from the page buffer 30(ⓐ).

There is a variation between the second bit line forcing voltage V2 and the target bit line forcing voltage.

Accordingly, upon reaching a time T2 that is previously set by the control logic circuit 160, the bit line forcing voltage clamp circuit 40 is enabled. The enabled bit line forcing voltage clamp circuit 40 applies a first bit line forcing voltage V1 to the second bit line BL2 of the cell string CS2 to which bit line forcing is to be conducted. Here, as described above, the DC voltage generator 150 generating a first bit line forcing voltage V1 that is at the same voltage level as the target bit line forcing level is used. By using the DC voltage generator 150, the first bit line forcing voltage V1 generated from the bit line forcing voltage clamp circuit 40 may be set to be near to the target bit line voltage as much as possible or to be the same (ⓑ).

The advantage of the programming method described with reference to FIG. 5 is that, after there is the variation between the second bit line forcing voltage V2 and the target bit line forcing voltage, a bit line forcing voltage that is higher than a target bit line forcing voltage level is lowered, and a bit line forcing voltage that is lower than the target bit line forcing voltage level is raised, by turning on the DC voltage generator 150, and accordingly, the variation is to be adjusted by using the bit line forcing voltage clamp circuit 40, and logic overhead may be reduced.

This will be further explained with reference to an example.

For example, a target bit line forcing level is to be set to 1 V. If the DC voltage generator 150 generating 1 V is enabled from the beginning, variation between a target bit line forcing level and an actually set bit line forcing level may decrease but in the worst case, excessively large logic overhead may be generated when forcing 1 V to all bit lines. That is, for example, in order to fill all of the bit line loading of 8 Kbytes from the beginning, the capacity of the 1 V DC voltage generator 150 is significantly increased. Thus, according to examples embodiment of inventive concepts, a bit line forcing voltage level is forced using the page buffer 30 as illustrated in FIG. 4, and then the bit line forcing voltage level is finely adjusted using the 1 V DC voltage generator 150.

Figure 6:
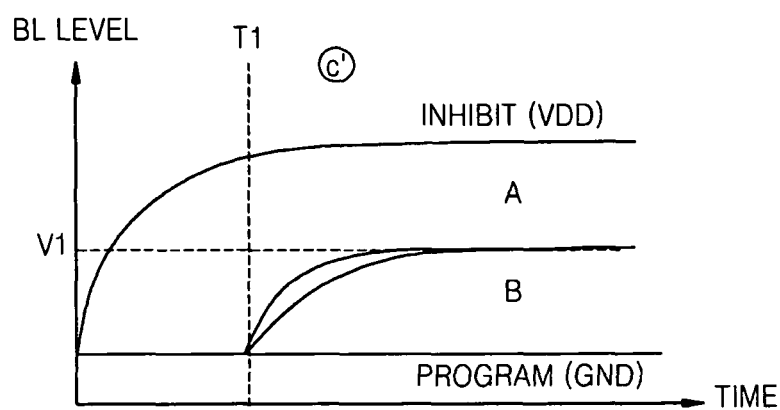
FIG. 6 is a graph illustrating a programming method of the nonvolatile memory device of FIG. 1, according to another example embodiment of inventive concepts.

FIG. 6 is a graph illustrating a programming method of the nonvolatile memory device 100 of FIG. 1, according to another example embodiment of inventive concepts. The basic principle thereof is the same as the method illustrated in FIG. 5. Thus description thereof will be omitted.

Referring to FIG. 6, in connection with FIGS. 1, 2, and 4, at a time T1 after a precharge operation, both the page buffer 30 and the bit line forcing voltage clamp circuit 40 are enabled (c').

For example, by enabling both the page buffer 30 and the DC voltage generator 150 that generates 1 V after the precharge operation, a voltage of 1 V not having variation may be generated.

In addition, a nonvolatile memory device according to an example embodiment of inventive concepts is capable of executing a programming method for forcing a bit line by using only the bit line forcing voltage clamp circuit.

Also, it should be understood by one of ordinary skill in the art based on inventive concepts that the nonvolatile memory device according to example embodiments of inventive concepts is capable of executing a programming method for forcing a bit line by using a page buffer and the bit line forcing voltage clamp circuit.

Figure 7:
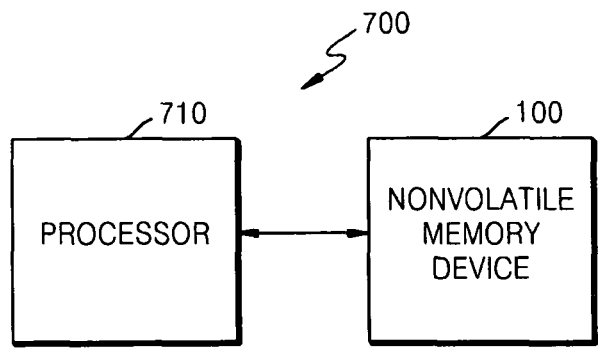
FIG. 7 is a block diagram illustrating a memory system including at least one nonvolatile memory device that is programmed according to one or more example embodiments of inventive concepts.

FIG. 7 is a block diagram illustrating a memory system 700 including a nonvolatile memory device 100 that is programmed according to one or more example embodiments of inventive concepts. For convenience of description, one nonvolatile memory device 100 is illustrated in FIG. 7; however, the example embodiment of FIG. 7 is not limited thereto and one or more nonvolatile memory devices may be included. Referring to FIG. 7, the memory system 700 includes a processor 710 coupled to the nonvolatile memory device 100 described with reference to FIG. 5. The memory system 700 may include separate integrated circuits, or the processor 710 and the nonvolatile memory device 100 may be arranged on the same integrated circuit. That is, the processor 710 and the nonvolatile memory device 100 of the memory system 700 may be arranged on separate integrated circuits, or the processor 710 and the nonvolatile memory device 100 may be arranged on the same integrated circuit. Examples of the processor 710 may include a microprocessor, a memory controller, and other types of control circuits such as an application-specific integrated circuit (ASIC).

The processor 710 may include components such as a RAM, a processing unit, a host interface, and a memory interface. A RAM may be used as an operating memory of the processor. The processing unit may control the overall operation of the processor 710. The host interface may include a protocol for executing data exchange between a host and the processor 710. For example, the processor 710 may be configured to communicate with one of various interface protocols such as USB, MMC, PCI-E, Advanced Technology Attachment (ATA), Serial-ATA, Parallel-ATA, SCSI, ESDI, and International Drive Electronics (IDE). The memory interface may interface with the nonvolatile memory device 100. The processor 710 may further include an error correction block. The error correction block may detect and correct an error of data read from the nonvolatile memory device 100.

Figure 8:
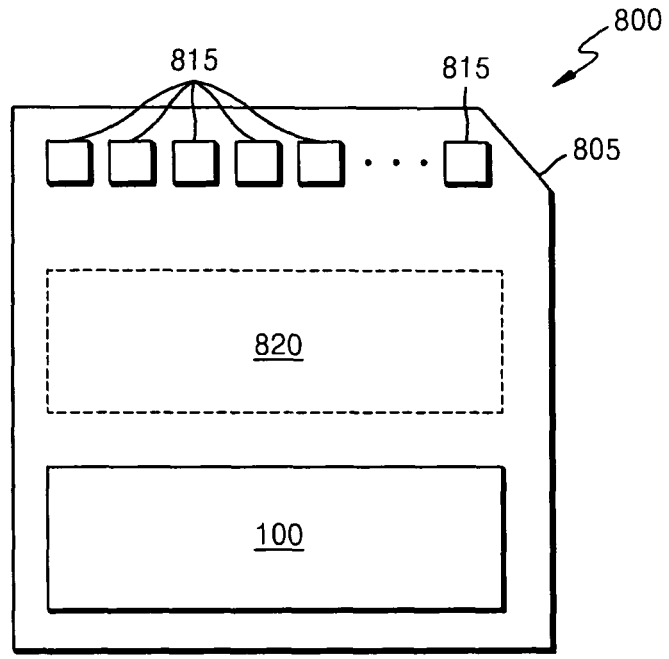
FIG. 8 is a diagram illustrating a memory module including at least one nonvolatile memory device that is programmed according to one or more example embodiments of inventive concepts.

FIG. 8 is a diagram illustrating a memory module 800 including a nonvolatile memory device 100 that is programmed according to one or more example embodiments of inventive concepts. For convenience of description, one nonvolatile memory device 100 is illustrated in FIG. 8; however, the example embodiment of FIG. 8 is not limited thereto and one or more nonvolatile memory devices may be included. The memory module 800 illustrated in FIG. 8 is a memory card but is not limited thereto, and the memory module 800 may be also be other types of mobile or portable memories such as a USB flash drive.

The memory module 800 may include a housing 805 surrounding the at least one nonvolatile memory device 100. The nonvolatile memory device 100 performs a programming operation at different times of applying a precharge voltage to a program inhibit cell according to a threshold voltage of the program inhibit cell or at different voltage levels of a precharge voltage applied to the program inhibit cell according to the threshold voltage of the program inhibit cell. The housing 805 includes at least one contact 815 for communication with a host device. Examples of the host device include a digital camera, a digital recording and replay device, a personal digital assistant (PDA), a memory card reader, and an interface hub. For example, a USB flash drive may include contacts 815 that are in the form of USB type-A male connectors. The contacts 815 provide an interface for transmitting a control signal, an address signal, and/or a data signal between the memory module 800 and a host device having a receptor compatible with the contacts 815.

The memory module 800 may include an additional circuit 820 which may be at least one integrated circuit and/or a separate device. The additional circuit 820 may include a control circuit that controls access to the nonvolatile memory device 100 and provides a translation layer between an external host and the nonvolatile memory device 100. The control circuit may be a memory controller. For example, there may not be one-to-one correspondence between the number of contacts 815 and connection circuits of the nonvolatile memory device 100. Thus, the memory controller 820 may selectively connect I/O connection circuits of the nonvolatile memory device 100 to the contacts 815 in order to receive an appropriate signal in an appropriate I/O connection circuit at an appropriate time or in order to provide an appropriate signal to an appropriate one of the contacts 815 at an appropriate time. Likewise, a communication protocol between a host device and the memory module 800 may be different from that which is necessary for access to the nonvolatile memory device 100. In order to achieve access to the nonvolatile memory device 100, the memory controller 820 may convert command sequences received from the host to appropriate command sequences. This conversion may include changes in signal voltage levels in addition to the conversion of the command sequences.

Figure 9:
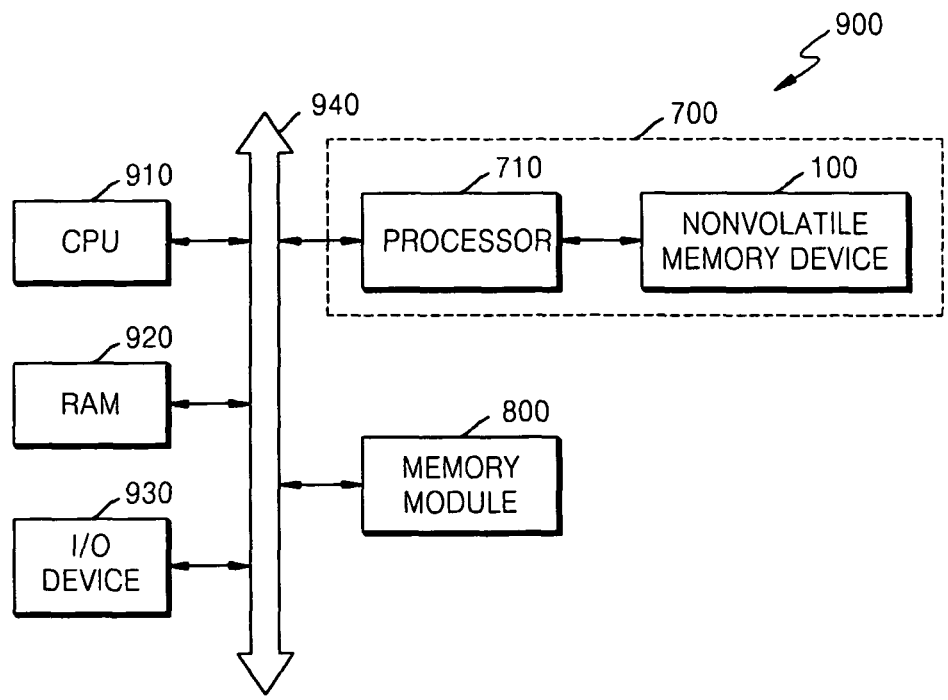
FIG. 9 illustrates a computer system including the memory system of FIG. 7 or the memory module of FIG. 8, according to an example embodiment of inventive concepts.

FIG. 9 illustrates a computer system 900 including the memory system 700 of FIG. 7 or the memory module 800 of FIG. 8, according to an example embodiment of inventive concepts. Referring to FIG. 9, the computer system 900 includes a central processing unit (CPU) 910, a RAM 920, an input/output device 930, and the memory system 700. The computer system 900 may include the memory module 800 instead of the memory system 700. The central processing unit 910, the RAM 920, and the input/output device 930 are connected via a system bus 940. Data that is provided via the input/output device 930 or processed via the central processing unit 910 is stored in the memory system 700 or in the memory module 800. The memory system 700 includes the processor 710 coupled to the nonvolatile memory device 100. The nonvolatile memory device 100 performs a programming operation at different application times of a precharge voltage applied to a program inhibit cell according to a threshold voltage of the program inhibit cell, or at different precharge voltage levels applied to the program inhibit cell according to the threshold voltage of the program inhibit cell. When the memory system 700 is mounted as a semiconductor disk device (SSD), the booting speed of the computer system 900 may significantly increase. The memory module 800 may be applied to mobile or portable memories.

While inventive concepts have been particularly shown and described with reference to example embodiments thereof, it will be understood that various changes in form and details may be made therein without departing from the spirit and scope of the following claims.

What is claimed is:

1. A nonvolatile memory device comprising:
   a bit line connected to a cell string;
   a page buffer connected to the bit line, the page buffer configured to output a target bit line forcing voltage level to the bit line during a programming operation;
   a bit line forcing voltage clamp circuit connected between the bit line and the page buffer, and the bit line forcing voltage clamp circuit configured to adjust the target bit line forcing voltage level to be less than a power voltage and greater than a ground voltage; and
   a direct current (DC) voltage generator configured to generate a bit line forcing voltage having a same voltage level as the target bit line forcing voltage level, wherein the bit line forcing voltage clamp circuit includes, at least one transistor configured to selectively output the generated bit line forcing voltage level to the bit line, and the DC voltage generator is configured to generate a bit line forcing voltage level of 1 V.

2. The nonvolatile memory device of claim 1, wherein the page buffer comprises:
a bit line shut off transistor, and the bit line forcing voltage clamp circuit is between the bit line shut off transistor and the bit line.

3. The nonvolatile memory device of claim 1, wherein the cell string comprises:
a plurality of memory cells serially connected, a string select transistor and a ground select transistor, the string select transistor and the ground select transistor are each connected to the memory cells, wherein
after the page buffer is enabled, the bit line forcing voltage clamp circuit is configured to be enabled.

4. The nonvolatile memory device of claim 1, wherein after the page buffer is enabled and when a previously set voltage level is formed to the bit line, the bit line forcing voltage clamp circuit is configured to be enabled.

5. The nonvolatile memory device of claim 1, wherein the page buffer and the bit line forcing voltage clamp circuit are configured to be enabled simultaneously.

6. The nonvolatile memory device of claim 1, wherein a scheme of the programming operation is an all bit line (ABL) architecture.

7. A memory system comprising:
a nonvolatile memory device; and
a controller configured to control the nonvolatile memory device,
wherein the nonvolatile memory device includes,
a bit line connected to a cell string;
a page buffer connected to the bit line, and the page buffer configured to output a target bit line forcing voltage level to the bit line during a programming operation;
a bit line forcing voltage clamp circuit connected between the bit line and the page buffer, and the bit line forcing voltage clamp circuit being configured to adjust the target bit line forcing voltage level to be less than a power voltage and greater than a ground voltage; and
a direct current (DC) voltage generator configured to generate a bit line forcing voltage having a same voltage level as the target bit line forcing voltage level, wherein
the bit line forcing voltage clamp circuit includes,
at least one transistor configured to selectively output the generated bit line forcing voltage level to the bit line, and
the DC voltage generator is configured to generate a bit line forcing voltage level of 1 V.

8. The memory system of claim 7, wherein the page buffer comprises:
a bit line shut off transistor, and the bit line forcing voltage clamp circuit is between the bit line shut off transistor and the bit line.

9. The memory system of claim 7, wherein after the page buffer is enabled and when a previously set voltage level is formed to the bit line, the bit line forcing voltage clamp circuit is configured to be enabled.

10. The memory system of claim 7, wherein the page buffer and the bit line forcing voltage clamp circuit are configured to be enabled simultaneously.

11. The memory system of claim 7, wherein a scheme of the programming operation is an all bit line (ABL) architecture.

12. The memory system of claim 7, wherein the cell string comprises:
a plurality of memory cells serially connected, a string select transistor and a ground select transistor, the string select transistor and the ground select transistor are each connected to the memory cells, wherein
after the page buffer is enabled, the bit line forcing voltage clamp circuit is configured to be enabled.

13. The memory system of claim 7, wherein the nonvolatile memory device and the controller constitute a semiconductor disk device.

14. The memory system of claim 7, wherein the nonvolatile memory device and the controller constitute a memory card.

* * * * *